(12) United States Patent
Fürgut et al.

(10) Patent No.: US 8,350,382 B2
(45) Date of Patent: Jan. 8, 2013

(54) SEMICONDUCTOR DEVICE INCLUDING ELECTRONIC COMPONENT COUPLED TO A BACKSIDE OF A CHIP

(75) Inventors: Edward Fürgut, Dasing (DE); Joachim Mahler, Regensburg (DE); Michael Bauer, Nittendorf (DE)

(73) Assignee: Infineon Technologies AG, Neubiberg (DE)

( * ) Notice: Subject to any disclaimer, the term of this patent is extended or adjusted under 35 U.S.C. 154(b) by 107 days.

(21) Appl. No.: 11/859,353

(22) Filed: Sep. 21, 2007

(65) Prior Publication Data

US 2009/0079065 A1    Mar. 26, 2009

(51) Int. Cl.
H01L 23/34 (2006.01)
H01L 23/48 (2006.01)
H01L 23/52 (2006.01)
H01L 29/40 (2006.01)

(52) U.S. Cl. ........ 257/724; 257/723; 257/750; 257/751; 257/774; 257/924; 257/E21.531

(58) Field of Classification Search .................. 257/777, 257/724, 774, 686, 751, 750, 723, 924, 778, 257/E23.023, E21.531, E23.085, E25.027, 257/E25.006, E25.021, E25.013
See application file for complete search history.

(56) References Cited

U.S. PATENT DOCUMENTS

| | | | |
|---|---|---|---|
| 4,897,708 A | 1/1990 | Clements | |
| 6,084,778 A | 7/2000 | Malhi | |
| 6,107,120 A * | 8/2000 | Ohtsuka et al. | 438/106 |
| 6,175,153 B1 * | 1/2001 | Yamada | 257/737 |
| 6,356,453 B1 | 3/2002 | Juskey et al. | |
| 6,465,892 B1 * | 10/2002 | Suga | 257/777 |
| 6,495,912 B1 | 12/2002 | Huang et al. | |
| 6,507,115 B1 * | 1/2003 | Hofstee et al. | 257/777 |
| 6,546,620 B1 | 4/2003 | Juskey et al. | |
| 6,667,551 B2 * | 12/2003 | Hanaoka et al. | 257/750 |
| 6,737,750 B1 * | 5/2004 | Hoffman et al. | 257/777 |
| 6,819,000 B2 * | 11/2004 | Magerlein et al. | 257/777 |
| 6,825,559 B2 | 11/2004 | Mishra et al. | |
| 6,867,501 B2 * | 3/2005 | Shibata | 257/778 |
| 6,933,613 B2 * | 8/2005 | Akashi | 257/778 |
| 7,045,886 B2 * | 5/2006 | Sawada | 257/686 |
| 7,060,525 B1 | 6/2006 | Tilly | |
| 7,112,887 B2 * | 9/2006 | Swan et al. | 257/777 |
| 7,166,917 B2 | 1/2007 | Yang et al. | |
| 7,193,308 B2 * | 3/2007 | Matsui | 257/686 |

(Continued)

FOREIGN PATENT DOCUMENTS

DE    WO 00/04577    1/2000

(Continued)

OTHER PUBLICATIONS

M. Brunnbauer et al., "An Embedded Device Technology Based on a Molded Reconfigured Wafer," Electronic Components and Technology Conference, 2006. Proceedings. 56th, Jun. 2006, (5 pages).

(Continued)

*Primary Examiner* — Teresa M Arroyo
(74) *Attorney, Agent, or Firm* — Dicke, Billig & Czaja, PLLC (57) ABSTRACT

A semiconductor package includes a substrate, at least one chip including a first side and a backside opposite of the first side, the first side electrically coupled to the substrate, a conductive layer coupled to the backside of the at least one chip, and at least one electronic component coupled to the conductive layer and in electrical communication with the substrate.

9 Claims, 5 Drawing Sheets

U.S. PATENT DOCUMENTS

| | | | |
|---|---|---|---|
| 7,202,560 | B2 | 4/2007 | Dungan et al. |
| 7,208,824 | B2 | 4/2007 | Lee et al. |
| 7,239,020 | B2 * | 7/2007 | Morkner .................... 257/777 |
| 7,459,776 | B1 * | 12/2008 | St. Amand et al. ........... 257/686 |
| 7,728,439 | B2 | 6/2010 | Nishiyama et al. |
| 2002/0003307 | A1 * | 1/2002 | Suga ........................... 257/777 |
| 2002/0074637 | A1 * | 6/2002 | McFarland .................. 257/686 |
| 2002/0074669 | A1 | 6/2002 | Watanabe |
| 2002/0074670 | A1 * | 6/2002 | Suga ........................... 257/777 |
| 2002/0114143 | A1 | 8/2002 | Morrison et al. |
| 2002/0153616 | A1 | 10/2002 | Kunihisa et al. |
| 2003/0116866 | A1 * | 6/2003 | Cher'Khng et al. ......... 257/780 |
| 2004/0021229 | A1 * | 2/2004 | Kinsman ...................... 257/777 |
| 2004/0256734 | A1 | 12/2004 | Farnworth et al. |
| 2004/0256736 | A1 * | 12/2004 | Kloster et al. ............... 257/777 |
| 2004/0262716 | A1 * | 12/2004 | Aoki ........................... 257/619 |
| 2004/0262772 | A1 * | 12/2004 | Ramanathan et al. ....... 257/777 |
| 2005/0023664 | A1 | 2/2005 | Chudzik et al. |
| 2005/0046038 | A1 * | 3/2005 | Farnworth et al. ........... 257/777 |
| 2005/0067716 | A1 | 3/2005 | Mishra et al. |
| 2005/0082669 | A1 * | 4/2005 | Saijo et al. ................... 257/737 |
| 2005/0146049 | A1 * | 7/2005 | Kripesh et al. .............. 257/776 |
| 2005/0167812 | A1 * | 8/2005 | Yoshida et al. .............. 257/686 |
| 2005/0173786 | A1 | 8/2005 | Huang |
| 2005/0205968 | A1 * | 9/2005 | Kim ............................ 257/621 |
| 2005/0224921 | A1 * | 10/2005 | Gupta et al. ................. 257/621 |
| 2005/0224962 | A1 * | 10/2005 | Akamatsu et al. ........... 257/724 |
| 2006/0113682 | A1 * | 6/2006 | Farnworth et al. ........... 257/782 |
| 2006/0170112 | A1 * | 8/2006 | Tanaka et al. ................ 257/777 |
| 2006/0245308 | A1 | 11/2006 | Macropoulos et al. |
| 2007/0132104 | A1 * | 6/2007 | Farnworth et al. ........... 257/774 |
| 2007/0235865 | A1 * | 10/2007 | Bauer et al. .................. 257/723 |
| 2008/0272476 | A1 * | 11/2008 | Do et al. ...................... 257/686 |
| 2008/0277801 | A1 * | 11/2008 | Nitsch ......................... 257/777 |
| 2009/0267232 | A1 * | 10/2009 | Morel et al. ................. 257/758 |
| 2011/0108971 | A1 * | 5/2011 | Ewe et al. .................... 257/686 |

FOREIGN PATENT DOCUMENTS

| | | | |
|---|---|---|---|
| JP | 07086612 A | | 3/1995 |
| JP | 10173084 A | * | 6/1998 |
| JP | 2003-60523 | | 2/2003 |

OTHER PUBLICATIONS

"Taking Wafer Level Packaging to the Next Stage: A 200 mm Silicon Technology Compatible Embedded Device Technology," Advanced Packaging Conference, SEMICON Europa 2006, Munich, Germany, Apr. 4, 2006 (17 pages).

"An Embedded Device Technology Based on a Molded Reconfigured Wafer," Electronic Components and Technology Conference, 2006. Proceedings. 56th, Jun. 2006, (5 pages).

* cited by examiner

SEMICONDUCTOR DEVICE INCLUDING ELECTRONIC COMPONENT COUPLED TO A BACKSIDE OF A CHIP

BACKGROUND

Market demand for smaller and more functional electronic devices has driven the development of semiconductor devices, packages, and recently, entire systems disposed on a chip. Many electronic devices, such as cellular telephones, employ a variety of design-specific electronic components. However, the space available inside the electronic devices is limited, particularly as the electronic devices are made smaller.

Most semiconductor package solutions provide a chip coupled to a carrier and one or more electronic components coupled to the carrier adjacent to the chip. Some of the electronic components are tuned in a specific manner according to the end application, usually by the end-user customer. Consequently, the package manufacturer is often required to supply a variety of packages, each of which is configured to be tuned by the customer in accordance with their desired end use. These design-specific packages limit the package manufacturer from offering a set of flexible, broad-based packaging solutions useful to multiple customers. Package manufacturers would prefer to fabricate packages having an economy of scale that are suited to meet the individual needs of many consumers.

Both the manufacturers and the consumers of these advanced electronic devices desire devices that are reduced in size and yet have increased device functionality.

For these and other reasons there is a need for the present invention.

SUMMARY

One aspect provides a semiconductor package including a substrate, at least one chip including a first side and a backside opposite of the first side, the first side electrically coupled to the substrate, a conductive layer coupled to the backside of the at least one chip, and at least one electronic component coupled to the conductive layer and in electrical communication with the substrate.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this Specification, the terms "coupled" and/or "electrically coupled" are not meant to mean that the elements must be directly coupled together; intervening elements may be provided between the "coupled" or "electrically coupled" elements.

Embodiments provide for the integration of electronic components that can be buried within a semiconductor package to open up space for mounting other components upon the carrier/substrate of the semiconductor package. Certain embodiments provide passive decoupling elements coupled to a backside of the chip, where the elements have a low parasitic inductance and are suitable for use in high frequency or high speed circuits.

Embodiments described below provide a universal semiconductor package solution having vertically stacked electronic components coupled to a backside of a chip. One or more chips are coupled to a carrier of the package, and one or more electronic components are coupled to a backside of the chip. Space can be saved on the carrier for other components or other wiring configurations since the electronic components are coupled to a backside of the chip rather than alongside the chip. The electronic components are coupled to the backside of the chip and electrically communicate with the carrier, in a manner that increases design functionality of the package.

Various embodiments provide electronic components coupled to a separate plate. The electronic components/plate may be function tested for performance prior to assembly to the backside of the chip. In this manner, the electronic components coupled to the backside of the chip are quality-checked ahead of assembly into the package, which improves package yield. In addition, directly coupling electronic components to a plate reduces solder flux and the contamination to printed circuit boards associated with solder flux.

Embodiments described below provide a package having electronic components coupled to a backside of a chip that are configured to be tuned by the manufacturer. For example, passive electronic components coupled to a backside of the chip are closer to the signal lines, which enable more accurate tuning of the passive component and chip. Electronic components tuned within the package by the manufacturer provide the end-user/consumer with a complete package solution. Electronic components that are tuned by the manufacturer enable the manufacturer to provide a more flexible, universal packaging solution to a variety of end-user consumers. The semiconductor packages described below accommodate any form of interposer structure including leadframes, redistribution layers, circuit boards, and embedded wafer level devices.

Figure 1:
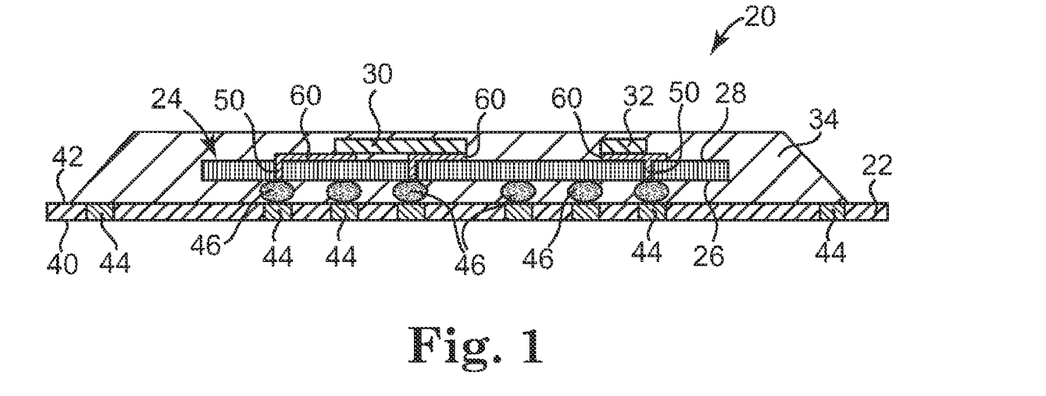
FIG. 1 is a cross-sectional view of a semiconductor package including a chip coupled to a carrier and an electronic component coupled to a backside of the chip according to one embodiment.

FIG. 1 is a cross-sectional view of a semiconductor package 20 according to one embodiment. Semiconductor package 20 includes a substrate 22, a chip 24 having a first side 26 configured for coupling to the substrate 22 and a backside 28 opposite of first side 26, a first electronic component 30 and a second electronic component 32 coupled to backside 28 of chip 24, and encapsulation material 34 deposited over chip 24, electronic components 30, 32, and a portion of substrate 22.

In one embodiment, substrate 22 includes a first surface 40 configured for coupling to another device, such as a printed circuit board, and a second surface 42 opposite first surface 40. In one embodiment, substrate 22 includes conductive pads 44 that communicate between first surface 40 and second surface 42. In one embodiment, first side 26 of chip 24 defines an active area of chip 24, and chip 24 is flip chip mounted on conductive pads 44 by one or more solder bumps 46. In this embodiment, substrate 22 is a carrier configured to accommodate flip chip mounting of chip 24 onto conductive pads 44. In other embodiments, substrate 22 includes any suitable interposer such as a leadframe, a circuit board, a redistribution layer of an embedded wafer level device, or other suitable carrier.

In one embodiment, chip 24 includes one or more vias 50 extending between and defining an electrical pathway from first side 26 to backside 28. In one embodiment, vias 50 include holes, wire-holes, or openings extending through chip 24 that are configured to enable wiring/connection to chip 24. Chip 24 includes memory chips, logic chips, semiconductor chips in general, and/or any suitable integrated circuit chip.

In one embodiment, electronic components 30, 32 include passive components. Suitable passive components include resistors, capacitors, inductors, or other electronic components characterized as having a specific electrical characteristic and being incapable of executing an electronic instruction. In one embodiment, electronic components 30, 32 are active components such as an active chip or other logic device characterized as being capable of performing an action such as an execution of an electronic instruction. In one embodiment, one of the electronic components 30, 32 is a passive component and the other of the electronic components 30, 32 is an active component.

In one embodiment, electronic components 30, 32 are coupled to backside 28 of chip 24 by a conductive layer 60. In one embodiment, conductive layer 60 is deposited onto backside 28 of chip 24 and fills vias 50 to form an electrical pathway extending from electrical components 30, 32 through conductive layer 60, through vias 50, across bumps 46, and through conductive pads 44. In one embodiment, conductive layer 60 includes a metallization layer, or a metallization multilayer, that is configured to electrically couple electronic components 30, 32 to backside 28 of chip 24. Conductive layer 60 is deposited on backside 28 of chip 24 in a suitable deposition process, including sputtering, vapor deposition, enhanced and/or assisted vapor deposition, galvanic deposition, or other suitable process.

In one embodiment, conductive layer 60 is deposited onto backside 28 of chip 24 and provides both a solder pad for electronic components 30, 32 and an integral electromagnetic shield for chip 24. In one embodiment, conductive layer 60 is deposited over only a portion (i.e., less than an entirety) of backside 28 of chip 24. In this manner, the possibility of creating an electrical short relative to chip 24 is minimized. In another embodiment, conductive layer 60 is deposited over the entire backside 28 of chip 24 in selectively balancing voltage compensation for chip 24.

In one embodiment, encapsulation material 34 includes epoxy, resin, polymeric materials, or other suitable electrically insulating materials that are suited for molding when fabricating package 20.

Semiconductor package 20 provides passive and/or active electronic components 30, 32 coupled to backside 28 of chip 24. The electronic components 30, 32 are closer to the signal lines leading to the chip 24, which enables more accurate tuning of the components 30, 32 in semiconductor package 20.

Figure 2A:
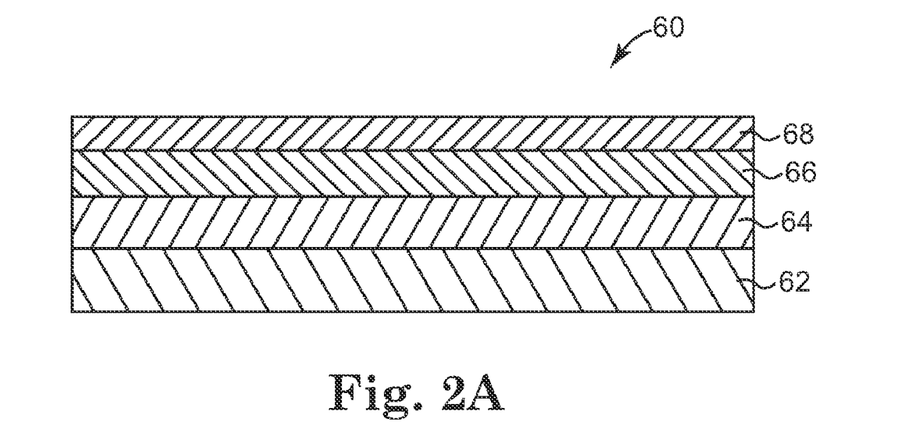
FIGS. 2A and 2B are cross-sectional views of two embodiments of a conductive multilayer structure configured to couple the electronic component to the backside of the chip shown in FIG. 1.

FIG. 2A is a cross-sectional view of conductive layer 60 according to one embodiment. In one embodiment, conductive layer 60 is a multilayer structure including the first layer 62 configured to contact backside 28 of chip 24 (FIG. 1), a second layer 64, a third layer 66, and a fourth layer 68 that is configured to provide an electrical coupling surface to which electrical components 30, 32 are connected. In one embodiment, first layer 62 is a metal layer including aluminum or other suitable metal configured for coupling to backside 28 of chip 24. In one embodiment, second layer 64 includes titanium, and third layer 66 includes nickel or a composition including nickel such as nickel vanadium (Ni—V). In one embodiment, fourth layer 68 includes a conductive metal such as silver, copper, or gold, or other suitable electrical connection layer.

Figure 2B:
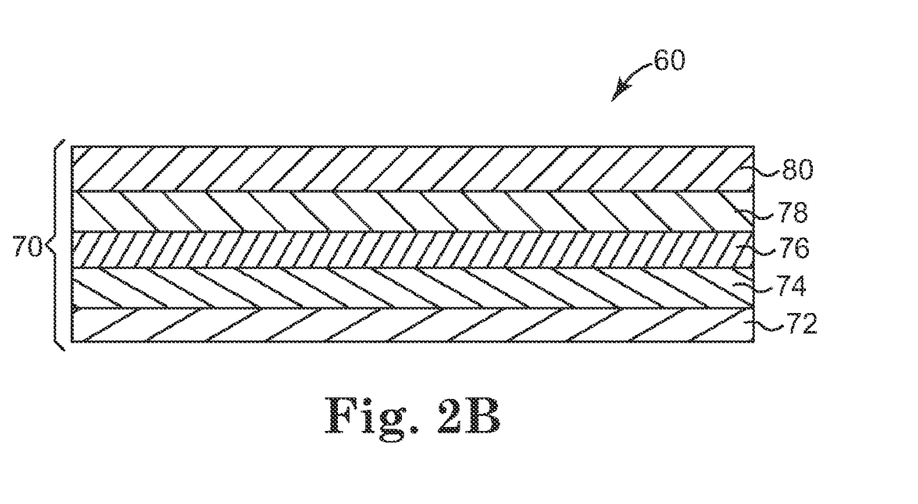

FIG. 2B is a cross-sectional view of conductive layer 60 according to another embodiment. In one embodiment, conductive layer 60 includes a multilayer stack 70 including a first layer 72, a second layer 74, a third layer 76, a fourth layer 78, and a fifth layer 80. Other suitable numbers of layers in stack 70 are also acceptable. In general, layers 72, 74, 76, 78 are similar to layers 62, 64, 66, 68, respectively, as described above. In one embodiment, layer 80 is provided as a diffusion barrier configured to minimize the migration of metal ions from layer 78 into electronic components 30, 32. For example, in one embodiment layer 78 is a metal such as silver, and layer 80 includes titanium that is configured to provide a diffusion barrier against the migration of silver ions from layer 78 into electronic components 30, 32. In one embodiment, layer 80 includes titanium, alloys of titanium, or compositions of titanium, although other suitable forms for diffusion barrier of layer 80 are also acceptable.

Embodiments described herein include a layer 60 is deposited onto backside 28 of chip 24, where layer 60 integrally seals chip 24 from destructive electromagnetic interference and provides a communication pad for the attachment of electronic components 30, 32.

Figure 3:
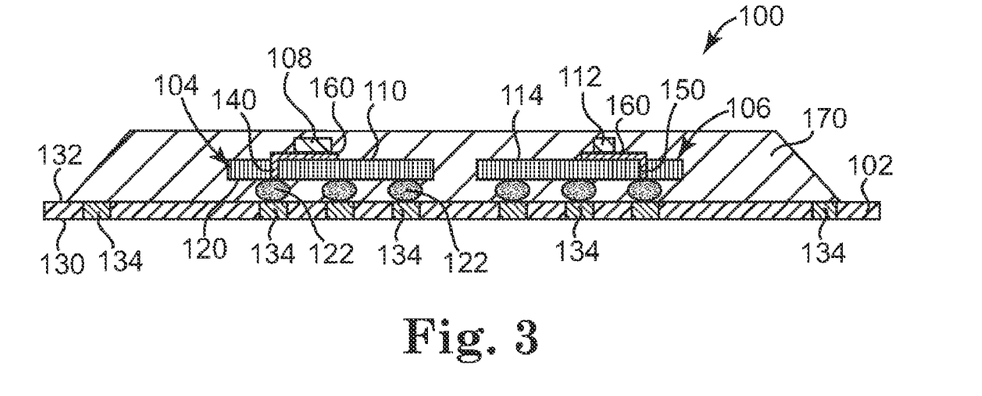
FIG. 3 is a cross-sectional view of a semiconductor package including multiple chips coupled to a carrier, where each chip includes an electronic component coupled to a backside of the chip according to one embodiment.

FIG. 3 is a cross-sectional view of a semiconductor package 100 according to another embodiment. In one embodiment, semiconductor package 100 includes a carrier 102, a first chip 104 and a second chip 106 coupled to carrier 102, a first electronic component 108 coupled to a backside 110 of first chip 104, and a second electronic components 112 coupled to a backside 114 of second chip 106. In one embodiment, chip 104 includes a first side 120 opposite backside 110, where first side 120 is an active area and chip 104 is flip chip mounted to carrier 102 by bumps 122 such that active area 120 is oriented toward carrier 102. Other forms of chips 104, 106 and other mounting formats are also acceptable.

In one embodiment, carrier 102 includes a first surface 130 configured for coupling to another device, such as a printed circuit board, a second surface 132 opposite first surface 130, and a plurality of conductive pads 134 extending between first surface 130 and second surface 132. In one embodiment, bumps 122 electrically couple chips 104, 106 to pads 134 of carrier 102.

In one embodiment, chip 104 includes one or more vias 140 extending between backside 110 and first side 120, and chip 106 likewise includes one or more vias 150 extending through chip 106. In one embodiment, metallization layers 160 are deposited on backside 110 of chip 104 and backside 114 of chip 106. Metallization layer 160 includes metallization layers as described above in FIGS. 2A and 2B, and conductive plates as described below.

Semiconductor package 100 provides multiple chips 104, 106 coupled to substrate 102 and electronic components 108, 112 coupled to a backside 110, 114 of chips 104, 106, respectively. In one embodiment, semiconductor package 100 optionally includes an encapsulation material 170 deposited over chips 104, 106, electronic components 108, 112, and a portion of substrate 102.

Figure 4:
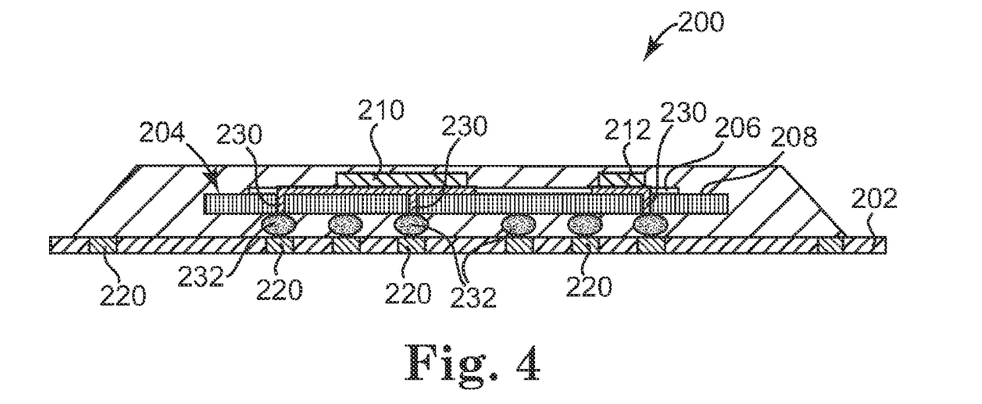
FIG. 4 is a cross-sectional view of a semiconductor package including a chip coupled to a carrier, multiple electronic components coupled to a through-hole plate, where the plate is coupled to a backside of the chip according to one embodiment.

FIG. 4 is a cross-sectional view of a semiconductor package 200 according to another embodiment. In one embodiment, semiconductor package 200 includes an interposer 202 or a carrier 202, a chip 204 electrically coupled to carrier 202, a plate 206 configured to be electrically coupled to a backside 208 of chip 204, a first electronic component 210 coupled to plate 206, and a second electronic component 212 coupled to plate 206.

Interposer 202 or carrier 202 is similar to substrate 22 described above and includes conductive pads 220. Chip 204 is similar to chip 24 (FIG. 1) described above and includes active chips, logic chips, or other integrated circuit chips. Chip 204 provides vias 230 or wire holes 230 extending through chip 204. Vias 230 are configured to provide an electrical communication path through chip 204. In one embodiment, chip 204 is coupled to interposer 202 by bumps/connectors 232, and electronic components 210, 212 electrically communicate with conductive pads 220.

Plate 206 is configured to support electronic components 210, 212 and provide an electrical connection between electronic components 210, 212 and chip 204. In one embodiment, plate 206 is a direct component plate defining a series of through-holes extending vertically (as oriented in FIG. 4) through plate 206. In one embodiment, a conductive material, such as paste or solder or other metal layer, is deposited onto plate 206 to form an electrical pathway through plate 206 that is suitable for electrically connecting electronic components 210, 212 with chip 204 and pads 220 of interposer 202.

In one embodiment, plate 206 is coupled to a backside 208 of chip 204, and electronic components 210, 212 are subsequently mounted to plate 206. In an exemplary embodiment, electronic components 210, 212 are direct copper bonded to plate 206 with a copper metal layer. In another embodiment described below, electronic components 210, 212 are first mounted to plate 206, tested for function and performance, and plate 206 is subsequently mounted to backside 208 of chip 204. In any regard, semiconductor package 200 includes multiple electronic components 210, 212 coupled to backside 208 of chip 204 in a vertical manner that enables package 200 to provide available space on carrier 202 for other components.

Figure 5:
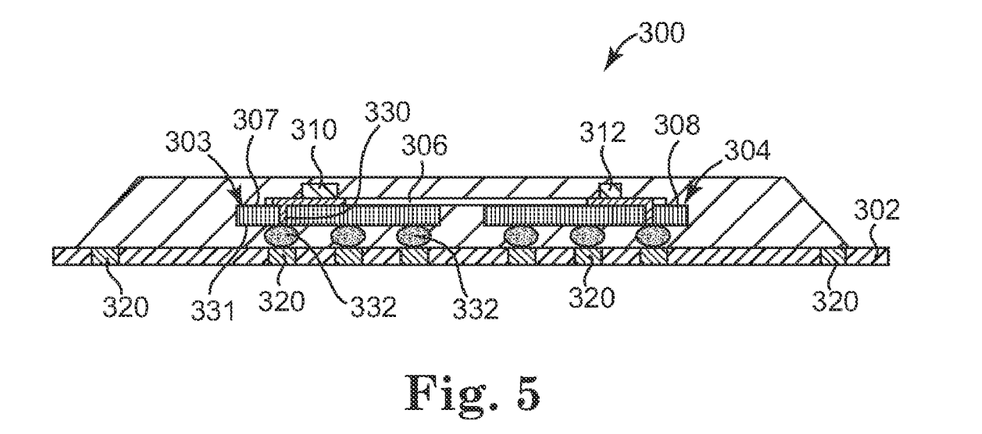
FIG. 5 is a cross-sectional view of a semiconductor package including multiple chips coupled to a carrier, multiple electronic components coupled to a through-hole plate, where the plate is coupled to a backside of each of the chips according to one embodiment.

FIG. 5 is a cross-sectional view of a semiconductor package 300 according to another embodiment. Semiconductor package 300 includes a substrate 302, a first chip 303 and a second chip 304 coupled to substrate 302, a plate 306 coupled to a backside 307 of chip 303 and a backside 308 of chip 304, and multiple electronic components 310, 312 coupled to plate 306.

In one embodiment, carrier 302 includes pads 320 configured to electrically couple package 300 to other devices, such as printed circuit boards. In one embodiment, chip 303 includes vias 330 communicating between backside 307 and an active side 331, and active side 331 of chip 303 is flip chip mounted to pads 320 by bumps 332. In one embodiment, chip 304 is likewise flip chip mounted to pads 320. Other forms of mounting chips 303, 304 to carrier 302 are also acceptable.

In one embodiment, plate 306 is similar to plate 206 described above in FIG. 4 and includes a direct component plate fabricated to include a plurality of through-holes extending through plate 306. In one embodiment, electronic components 310, 312 are coupled to plate 306 by a solder or other conductive material. The solder or other conductive material fills the through-holes formed in plate 306 such that electronic components 310, 312 electrically communicate through plate 306, through chips 303, 304 and bumps 332 to pads 320 of carrier 302.

Semiconductor package 300 includes multiple electronic components 310, 312 coupled to a plate 306 that is coupled to the backsides of chips 303, 304, thus enabling package 300 to provide available space on carrier 302 for other components.

Figure 6A:
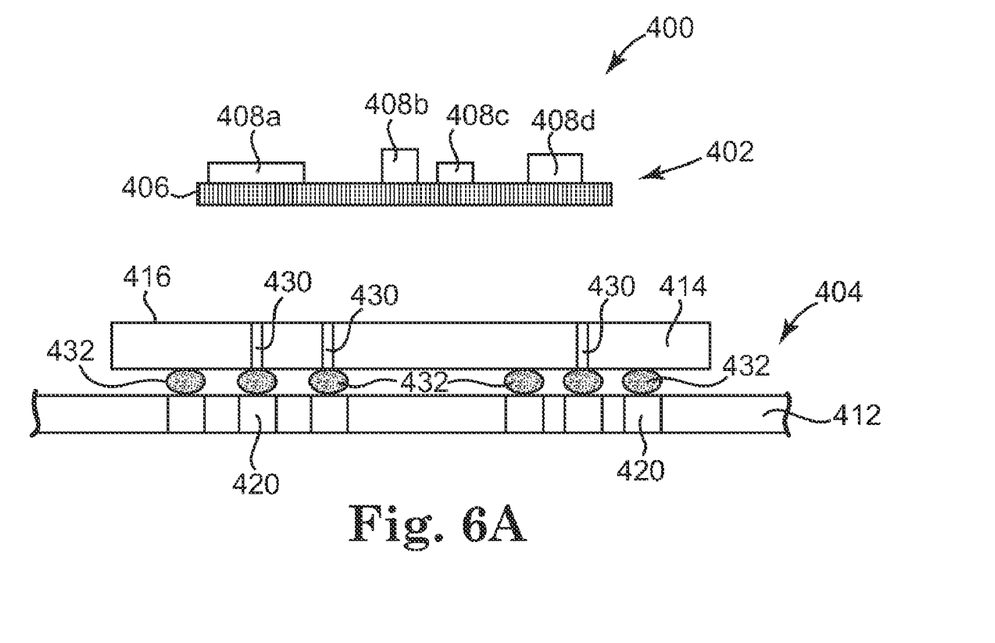
FIG. 6A is an exploded side view of an electronic component assembly configured for coupling to a chip assembly according to one embodiment.

FIG. 6A is an exploded side view of a semiconductor package assembly 400 according to one embodiment. Semiconductor assembly 400 includes an electronic component assembly 402 configured for coupling to a chip assembly 404.

In one embodiment, electronic component assembly 402 includes a conductive plate 406 supporting one or more electronic components 408a, 408b, 408c, 408d. In one embodiment, electronic components 408a-408d include one or more passive components and/or one or more active components. For example, in one embodiment, electronic component 408a is a passive component, and electronic component 408b is an active component. Electronic components 408a-408d are electrically coupled to plate 406 in a manner that enables electronic component assembly 402 to be function-tested and/or quality checked prior to mounting plate 406 to chip assembly 404.

In one embodiment, chip assembly 404 includes a carrier 412 and at least one chip 414 defining a chip backside 416 coupled to carrier 412. In other embodiments, multiple such chips 414 are coupled to carrier 412. In one embodiment, carrier 412 includes a plurality of conductive pads 420, and chip 414 includes a plurality of vias 430 extending through a thickness of the chip 414. In one embodiment, chip 414 is coupled to carrier 412 by solder bumps 432, such that vias 430 are in electrical communication with pads 420.

In one embodiment, electronic component assembly 402 is fabricated and function-tested prior to coupling to chip assembly 404. For example, in one embodiment electronic components 408a-408d are coupled to plate 406 and electronic component assembly 402 is function-tested to verify the desired performance of electronic components 408a-408d. Thus, electronic components 408a-408d are validated and their performance is assured before assembly 402 is fabricated to complete a semiconductor package. In this manner, the yield of electronic components 408a-408d, and the yield of semiconductor packages fabricated from electronic component assembly 402 is increased.

Figure 6B:
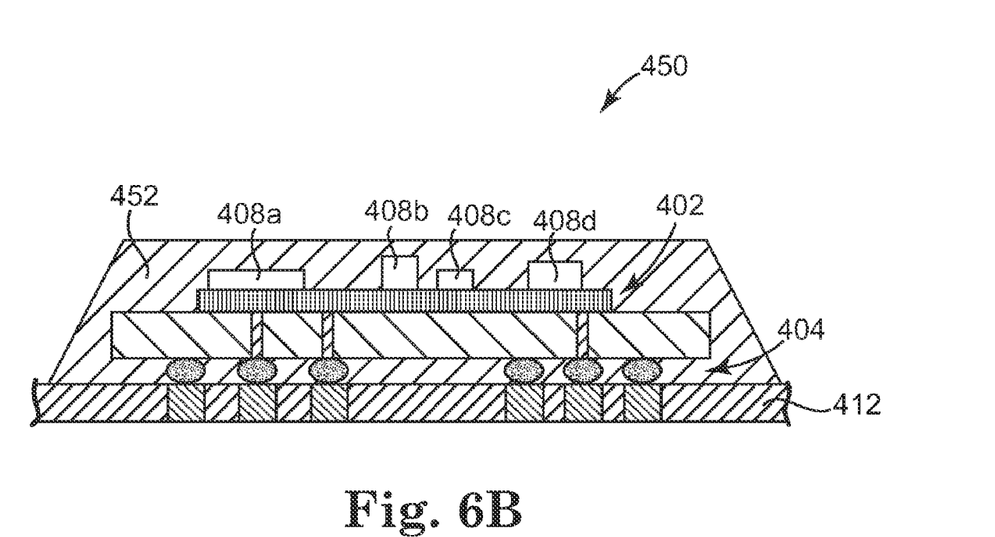
FIG. 6B is a cross-sectional view of the electronic component assembly shown in FIG. 6A coupled to the chip assembly shown in FIG. 6A.

FIG. 6B is a cross-sectional view of a semiconductor package 450 according to one embodiment. Semiconductor package 450 includes electronic component assembly 402 coupled to chip assembly 404, and encapsulation material 452 deposited over electronic component assembly 402 and a portion of chip assembly 404. In one embodiment, electronic component assembly 402 is electrically function-tested and/or quality checked before it is coupled to chip assembly 404. In one embodiment, encapsulation material 452 includes epoxy, resin, polymeric materials, or other suitable electrically insulating material. In one embodiment, encapsulating material 452 is an epoxy that is molded over electronic component assembly 402 and a portion of chip assembly 404.

Figure 7:
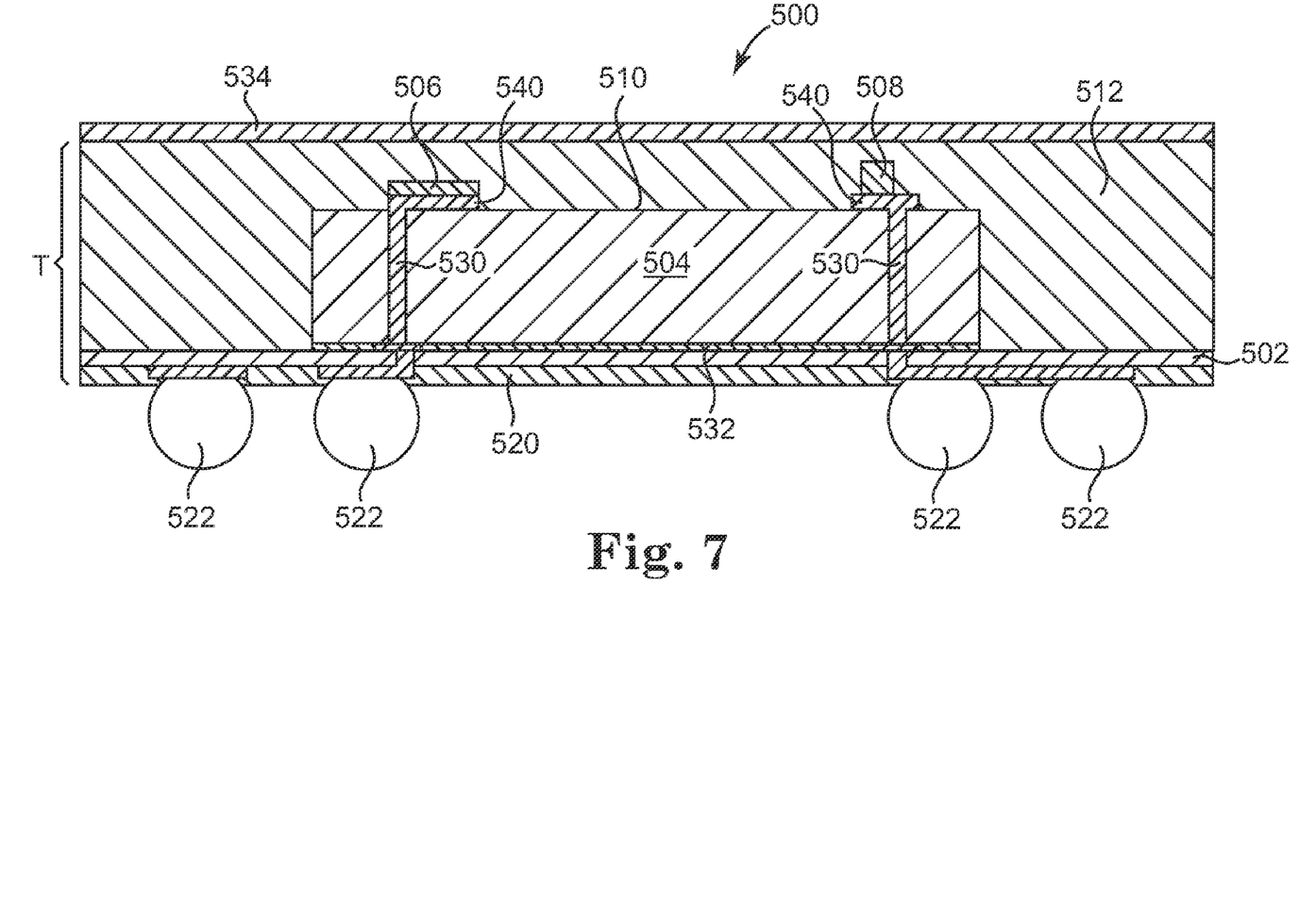
FIG. 7 is a cross-sectional view of an embedded wafer level package including a chip coupled to an interposer and multiple electronic components coupled to a backside of the chip according to one embodiment.

FIG. 7 is a cross-sectional view of a semiconductor package 500 according to another embodiment. Semiconductor package 500 includes an interposer 502, a chip 504 coupled to interposer 502, a first electronic device 506 and a second electronic device 508 coupled to a backside 510 of chip 504, and material 512 molded around electronic devices 506, 508 and chip 504.

In one embodiment, interposer 502 includes a redistribution layer 520 that has been de-bonded from a carrier system (not shown) and includes interconnects 522. In one embodiment, redistribution layer 520 and interconnects 522 combine to define a ball grid array configured for connection to another electronic device, such as a printed circuit board.

In one embodiment, chip 504 includes vias 530 extending from backside 510 of chip 504 to a connector side 532 of chip 504. In one embodiment, chip 504 and material 512 combine to define a portion of an embedded wafer level ball grid array chip assembly, or a wafer level package, that is characterized by the absence of a first level interconnect. For example, in one embodiment chip 504 is directly formed onto interposer 502 such that chip 504 and interposer 502 are electrically coupled and do not have a wire bonded first level interconnect. In this regard, interposer 502 and chip 504 provide a "thin" wafer level package having a package thickness T of less than about 200 microns. For example, in one embodiment chip 504 has a thickness of about 50 microns, and material 512 is deposited over chip 504 and interposer 502 such that semiconductor package 500 is provided as a thin wafer level package having a thickness T of less than about 200 microns.

In one embodiment, package 500 includes an optional stiffener layer 534 deposited onto material 512 that is configured to provide structural integrity to the thin wafer level package. In this manner, although package 500 is generally thin and suited to low-weight and high device density applications, stiffener layer 534 provides package 500 with a suitable level of package robustness and durability. It is to be understood that stiffener layer 534 is not necessarily drawn to scale. Stiffener layer 534 includes epoxy, plastic, reinforced layers, and other suitably stiff material.

In one embodiment, electronic components 506, 508 are coupled to backside 510 of chip 504 by a conductive layer 540. In one embodiment, conductive layer 540 is a metallization layer. In another embodiment, conductive layer 540 is a multi-layer metallization coating deposited onto backside 510 of chip 504. In this manner, electronic components 506, 508 electrically communicate with conductive layer 540, vias 530, interposer 502, and interconnects 522. Thus, electronic components 506, 508 are coupled in an electrical pathway with interconnects 522.

In one embodiment, conductive layer 540 is deposited onto only a portion of backside 510 of chip to minimize the potential for undesirable electrical shorts to portions of chip backside 510 that do not include electronic components 506, 508.

Figure 8:
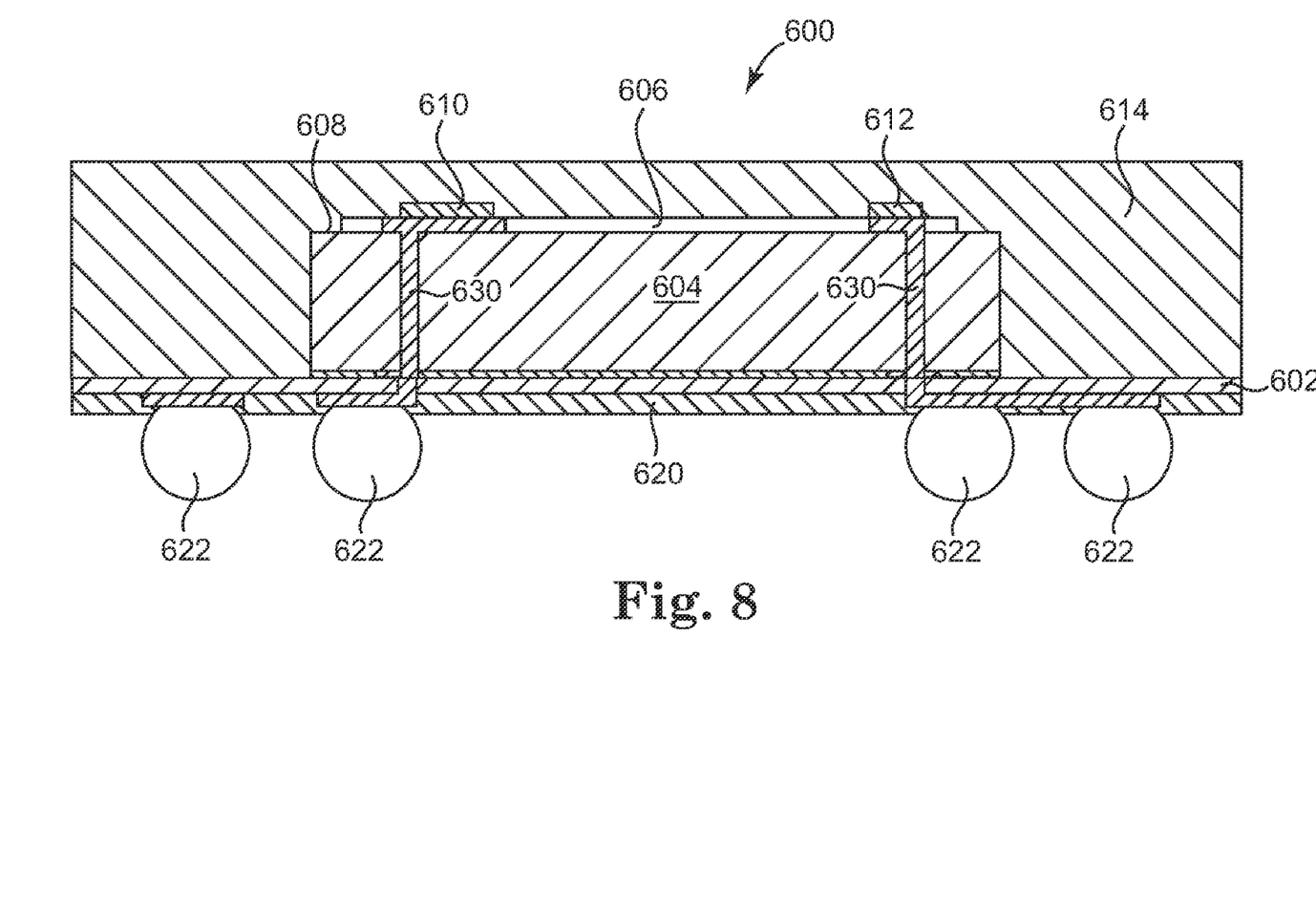
FIG. 8 is a cross-sectional view of an embedded wafer level package including a chip coupled to an interposer, and multiple electronic components coupled to a plate that is coupled to a backside of the chip according to one embodiment.

FIG. 8 is a cross-sectional view of an embedded wafer level package 600 according to another embodiment. Embedded wafer level package 600 includes an interposer 602, a chip 604 coupled to interposer 602, a plate 606 coupled to a backside 608 of chip 604, a first electronic device 610 and a second electronic device 612 coupled to plate 606, and a material 614 molded over electronic components 610, 612 and chip 604.

In one embodiment, chip 604 and interposer 602 are provided as a wafer level package including a redistribution layer 620 that has been de-bonded from a carrier system (not shown) and includes interconnects 622. In one embodiment, redistribution layer 620 and interconnects 622 combine to define a ball grid array configured for connection to another electronic device, such as a printed circuit board.

In one embodiment, chip 604 includes vias 630 extending from backside 608 of chip 604 to interconnects 622. In one embodiment, chip 604 and material 614 combine to define a portion of an embedded wafer level ball grid array chip assembly, or a wafer level package, that is characterized by the absence of a first level interconnect, similar to and as described above for package 500 in FIG. 7.

In one embodiment, package 600 includes an optional stiffener layer similar to stiffener layer 534 (FIG. 7) described above. Stiffener layer is configured to provide structural integrity to the thin wafer level package.

In one embodiment, electronic components 610, 612 are coupled to backside 608 of chip 604 by plate 606. In one embodiment, plate 606 is similar to plate 206 (FIG. 4) and includes a plate that defines multiple through-holes or wire holes suited for electrically connecting components to plate 606 and plate 606 to chip 604. In this manner, electronic components 610, 612 are coupled to plate 606 and electrically communicate with vias 630, interposer 602, and interconnects 622 to form an electrical pathway with interconnects 622.

Plate 606 enables the electrical connection and function testing of components 610, 612 prior to final assembly of package 600. Placement of components 610, 612 directly onto plate 606 forms a good electrical connection and leaves room on interposer 602 for other components or other wiring schemes. When one or more of components 610, 612 include passive components, the passive components are electrically coupled closer to the signal lines of package 600, thus enabling the passive components to be easy tuned for application-specific functions.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments of electronic components coupled to a backside of a chip as discussed herein. Therefore, it is intended that this invention be limited only by the claims and the equivalents thereof.

What is claimed is:

1. An electronic device comprising:
   a substrate;
   at least one chip including a first side and a backside opposite of the first side, the first side electrically coupled to the substrate; and
   means for electrically coupling at least one electronic component to the backside of the chip such that the electronic component is in electrical communication with the substrate,
   wherein the means for electrically coupling at least one electronic component to the backside of the chip comprises a metallization layer deposited on the chip between the backside of the chip and the electronic component, the metallization layer comprising a multi-layer structure including a diffusion barrier layer, and
   wherein each layer in the multi-layer structure is a metal layer, the multi-layer structure includes at least four metal layers, at least three of the metal layers have a same surface area parallel to the backside of the at least one chip, and the diffusion barrier layer comprises a topmost metal layer of the multi-layer structure opposite a bottommost metal layer contacting the chip.

2. A semiconductor package comprising:
   a substrate;
   at least one chip including a first side and a backside opposite of the first side, the first side electrically coupled to the substrate;
   a conductive layer coupled to the backside of the at least one chip, the conductive layer comprising a multilayer stack including at least four metal layers; and
   at least one electronic component coupled to the conductive layer and in electrical communication with the substrate,
   wherein at least three of the metal layers have a same surface area parallel to the backside of the at least one chip, and wherein a topmost metal layer of the multi-layer stack opposite a bottommost metal layer contacting the chip comprises a diffusion barrier layer.

3. The semiconductor package of claim 2, wherein the diffusion barrier layer comprises titanium.

4. The semiconductor package of claim 2, wherein the first side of at least one chip is an active side, the at least one chip comprising vias extending between the active side and the backside, the active side flip chip bonded to the substrate by bumps, and the at least one electronic component electrically communicating with the substrate through the vias and the bumps.

5. The semiconductor package of claim 2, wherein the substrate comprises a redistribution layer and the at least one chip comprises an embedded chip electrically coupled to the redistribution layer, the at least one chip comprising vias extending between the first side and the backside, and the at least one electronic component electrically communicating with the redistribution layer through the vias.

6. The semiconductor package of claim 2 wherein the at least one electronic component comprises a passive electrical component selected from the group consisting of a resistor, an inductor, and a capacitor.

7. The semiconductor package of claim 2, wherein the at least one electronic component comprises an active electrical component.

8. The semiconductor package of claim 2, wherein the conductive layer is deposited over less than an entirety of the backside of the at least one chip.

9. The semiconductor package of claim 2, wherein the semiconductor package has a thickness less than approximately 200 microns.

* * * * *